United States Patent
Sakakibara et al.

(10) Patent No.: US 7,425,714 B2
(45) Date of Patent: Sep. 16, 2008

(54) MEASUREMENT METHOD OF ELECTRON BEAM CURRENT, ELECTRON BEAM WRITING SYSTEM AND ELECTRON BEAM DETECTOR

(75) Inventors: Makoto Sakakibara, Kokubunji (JP); Yoshinori Nakayama, Sayama (JP); Hiroya Ohta, Kodaira (JP); Yasunari Sohda, Kawasaki (JP); Noriyuki Tanaka, Hitachinaka (JP); Yasuhiro Someda, Tochigi (JP)

(73) Assignees: Hitachi High-Technologies Corporation, Tokyo (JP); Canon Kabushiki Kaisha, Tokyo (JP)

( * ) Notice: Subject to any disclaimer, the term of this patent is extended or adjusted under 35 U.S.C. 154(b) by 262 days.

(21) Appl. No.: 11/207,710

(22) Filed: Aug. 22, 2005

(65) Prior Publication Data
US 2006/0060775 A1      Mar. 23, 2006

(30) Foreign Application Priority Data
Sep. 9, 2004   (JP)  .............................. 2004-261776

(51) Int. Cl.
G21K 5/10 (2006.01)
(52) U.S. Cl. .............................. 250/492.22; 250/492.1; 250/492.2; 250/492.3; 250/397
(58) Field of Classification Search .... 250/492.1–492.3
See application file for complete search history.

(56) References Cited

U.S. PATENT DOCUMENTS

| | | | | |
|---|---|---|---|---|
| 5,117,111 A | * | 5/1992 | Nakamura et al. | 250/310 |
| 6,768,324 B1 | * | 7/2004 | Yamada et al. | 324/751 |
| 6,943,507 B2 | * | 9/2005 | Winkler et al. | 315/382 |
| 6,946,857 B2 | * | 9/2005 | Yamada et al. | 324/751 |
| 6,975,125 B2 | * | 12/2005 | Yamada et al. | 324/751 |
| 7,138,629 B2 | * | 11/2006 | Noji et al. | 250/311 |
| 2004/0207415 A1 | * | 10/2004 | Yamada et al. | 324/751 |
| 2004/0239347 A1 | * | 12/2004 | Yamada et al. | 324/751 |
| 2004/0256556 A1 | * | 12/2004 | Winkler et al. | 250/310 |
| 2007/0023659 A1 | * | 2/2007 | Sergeevich et al. | 250/311 |

FOREIGN PATENT DOCUMENTS

| | | |
|---|---|---|
| JP | 02-208593 | 2/1989 |
| JP | 05-299328 | 4/1992 |
| JP | 3082662 | 3/1996 |
| JP | 2003-051437 | 8/2001 |
| JP | 2004-055933 | 7/2002 |

* cited by examiner

*Primary Examiner*—Jack I. Berman
*Assistant Examiner*—Andrew Smyth
(74) *Attorney, Agent, or Firm*—Reed Smith LLP; Stanley P. Fisher, Esq.; Juan Carlos A. Marquez, Esq.

(57) ABSTRACT

A technology capable of reducing the influence of the noise overlapped in a long transmission line when accurately measuring weak beam current in an electron beam writing system and capable of accurately and efficiently measuring weak beam current in a beam writing system using multiple beams is provided. With using a switch for connecting and disconnecting an electron beam detecting device and a detected signal line, the electron beam detecting device is disconnected from the detected signal line to accumulate the detected signals in the electron beam detecting device during the beam current measurement. Simultaneously with the finish of the measurement, the electron beam detecting device and the detected signal line are connected to measure the accumulated signals. Also, in order to simultaneously perform the measurement method, a plurality of electron beam detecting devices and switches are used to simultaneously measure a plurality of electron beams with high accuracy.

12 Claims, 7 Drawing Sheets

MEASUREMENT METHOD OF ELECTRON BEAM CURRENT, ELECTRON BEAM WRITING SYSTEM AND ELECTRON BEAM DETECTOR

CROSS-REFERENCE TO RELATED APPLICATION

The present application claims priority from Japanese Patent Application No. JP 2004-261776 filed on Sep. 9, 2004, the content of which is hereby incorporated by reference into this application.

TECHNICAL FIELD OF THE INVENTION

The present invention relates to a measurement method of electron beam current, an electron beam writing system and an electron beam detector. More particularly, the present invention relates to a technology effectively applied to the method and means for measuring the average current amount of electron beam and pulse beam and to the electron beam writing system which uses multiple electron beams and pulse beams to perform the writing.

BACKGROUND OF THE INVENTION

In the technology examined by the inventors of the present invention, for example, in the electron beam writing system used in the manufacture of a semiconductor integrated circuit device (LSI), the LSI has been increasingly miniaturized, the structure thereof has become complex more and more, and the capacity required for the pattern data has been increased. Therefore, the improvement of the writing accuracy and the improvement of the writing throughput have been demanded. For its achievement, in addition to the electron beam writing system using the variable shaped beam, the electron beam writing system using the character projection exposure in which the mask pattern is transferred through a reducing projection has been developed.

Also, as the next-generation lithography system, the development of the electron beam projection lithography represented by the EPL (Electron Projection Lithography) and the electron beam writing system using multiple beams in which multiple electron beams are simultaneously deflected and turned on/off depending on the exposed/non-exposed parts of a semiconductor wafer in the writing has been proceeding.

In any electron beam writing systems, it is necessary to measure the electron beam current to correct the dose of electron beam irradiation in the writing. The accurate control of the dose of electron beam irradiation leads to the improvement of the dimensional accuracy of the pattern. Therefore, the accurate measurement of the beam current of electron beam to be a standard for determining the irradiation dose is indispensable to perform the accurate writing.

As an example of the electron beam writing system, the electron beam writing system in which the electron beam is pulsed and the writing pattern is formed while controlling the pulse width during the beam-on time is known. The electron optical apparatus of this electron beam writing system is comprised of an evacuated vacuum column, an electron gun for generating electron beam, lens for focusing the electron beam, a blanking electrode and a blanking aperture for turning on/off the electron beam, an electron beam detecting device for measuring the beam current of the electron beam, a movable stage on which a sample to form a writing pattern is mounted, a deflector for determining a position of the electron beam on the stage, a cable terminal for leading the wiring system to the air and others.

In the electron beam writing system described above, the electron beam generated from the electron gun is focused and deflected by the lens and the deflector and then reaches the electron beam detecting device and the sample on the movable stage. During the beam-off time, the electron beam is deflected by the blanking electrode and is irradiated to the blanking aperture to block the electron beam. By applying the pulse voltage to the blanking electrode, the electron beam is turned on/off to generate the pulse beam.

By the control system of the electron beam writing system, the generated electron beam and pulse beam are irradiated to the electron beam detecting device. The signals detected by the electron beam detecting device are transferred to a measurement circuit through a detected signal line. Based on the measurement result, the amount of beam current of the electron beam is calculated. Then, the beam-on time in the writing is corrected based on the measurement data of the calculated amount of beam current. In this manner, the writing by the desired irradiation dose can be performed. Note that, in the electron beam writing system using the variable shaped beam, based on the measurement result of the beam current, the area of the electron beam is corrected to control the irradiation dose.

In the conventional beam current measurement, for example, as described in the Japanese Patent No. 3082662, a Faraday cup is used as an electron beam detecting device and an ammeter is used as a measurement circuit so as to measure the current value or the current density.

Also, as a method for correcting the dose of the electron beam irradiation, the technologies described in Japanese Patent Laid-Open Publication No. 5-299328 and No. 2003-51437 are known.

SUMMARY OF THE INVENTION

Incidentally, as a result of the examination for the technology of the electron beam writing system as described above by the inventors of the present invention, the following facts have been found out.

For example, in the electron beam writing system, the beam current is measured with high accuracy in order to form the microscopic patterns, and the dose of the electron beam irradiation is determined and controlled based on the measurement result. Since the beam current becomes weak in the writing of the microscopic patterns, the accurate current measurement is difficult in the conventional beam current measurement using the Faraday cup. In particular, in the writing system using multiple beams, each one electron beam is the weak and high-speed pulse beam. Therefore, the accurate measurement of such a weak and high-speed beam current by the usual Faraday cup and an ammeter is difficult from the viewpoint of the signal/noise ratio.

Meanwhile, the method in which the beam current i is integrated N times (N is the number of pulses) usually by an integrating circuit is known. In this method, the signals detected by the detecting device are transferred to the latter-stage integrating circuit to measure the signals integrated in the integrating circuit.

In the electron beam writing system, however, the diameter of the sample on which the writing is performed is usually large, for example, φ 200 to φ 300 mm, and thus, the movable range of the stage is also large. Therefore, the detected signal line from the electron beam detecting device to the latter-stage measurement circuit becomes long. For example, it is necessary to transmit the weak signals through the detected signal line of several tens centimeter at minimum and the detected signal line of several meters in the case of a large stage. In the case where the weak and high-speed signals are detected like in the electron beam writing system using multiple beams, if the conventional method using the Faraday cup or the method in which the signals are integrated in the latter-stage integrating circuit is used, the error occurs in the measurement of the current due to the noise overlapped on the long transmission path from the electron beam detecting device to the latter-stage measurement circuit (integrating circuit or amplifier circuit), and the improvement of the measurement accuracy is hindered.

Also, in the electron beam writing system using multiple beams in which the n electron beams are individually and quickly turned on/off depending on the exposed/non-exposed parts, the measurement time is n times as long as that of the case of using one beam, and the shortening of the measurement time is required. Note that n is a natural number.

Therefore, an object of the present invention is to provide a measurement method of electron beam current, an electron beam writing system and an electron beam detector which are required to form a pattern on a sample with high dimensional accuracy.

The above and other objects and novel characteristics of the present invention will be apparent from the description of this specification and the accompanying drawings.

The typical ones of the inventions disclosed in this application will be briefly described as follows.

More specifically, the electron beam writing system and the electron beam detector according to the present invention is comprised of a charging element for accumulating the current detected by the electron beam detecting device as electric charge and a switch for electrically connecting and disconnecting the charging element and the measurement circuit. The charging element and the switch shall be provided on a stage on which the electron beam detecting device is provided in the writing system. Ideally, the configuration in which the charging element and the switch are incorporated in the electron beam detecting device is desired. For example, the electron beam detecting device is a semiconductor diode.

Also, in the measurement method of electron beam current according to the present invention, simultaneously with or after electrically disconnecting the charging element and the measurement circuit by means of the switch, the electron beam is irradiated to the electron beam detecting device, and the electric charge is accumulated in the charging element. Then, after a predetermined beam irradiation time, the charging element and the measurement circuit is connected by means of the switch, and the amount of electron beam current is calculated based on the accumulated charge.

Further, in order to simultaneously measure a plurality of electron beams, a plurality of electron beam detecting devices are two-dimensionally arranged in the electron beam detector, and the device pitch in one direction thereof is set to twice or more of the range of the electron beam and to an integral multiple of the beam pitch of the plurality of electron beams so as to avoid the influence from the scattered electrons. Also, a plurality of charging elements for accumulating the current detected by the electron beam detecting device as electric charge and a plurality of switches for electrically connecting and disconnecting the plurality of charging elements and a plurality of measurement circuits are provided. The plurality of charging elements and switches shall be provided on a stage on which the electron beam detecting devices are provided in the writing system. Ideally, the configuration in which the plurality of charging elements and the switches are incorporated in the electron beam detecting devices is desired. For example, the plurality of electron beam detecting devices are a semiconductor diode array.

Then, simultaneously with or after electrically disconnecting the charging elements and the measurement circuits by means of the plurality of switches, a plurality of electron beams are irradiated at the same time, and the electric charge is accumulated in each of the charging elements. Then, after a predetermined beam irradiation time, the plurality of charging elements and the plurality of measurement circuits are connected by means of the plurality of switches, and the amount of electron beam current of each beam is calculated based on the accumulated charge.

In this manner, the accurate measurement in which the influence of noise overlapped in the long detected signal line inherent in the electron beam wiring system is reduced as much as possible can be realized. Also, it becomes possible to simultaneously measure a plurality of electron beams with high accuracy.

The effect obtained by the representative one of the inventions disclosed in this application will be briefly described as follows.

It becomes possible to perform the accurate measurement of electron beam current in which the noise overlapped in a detected signal line is reduced as much as possible, and the dose of irradiation in the electron beam writing system can be controlled with high accuracy.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1:
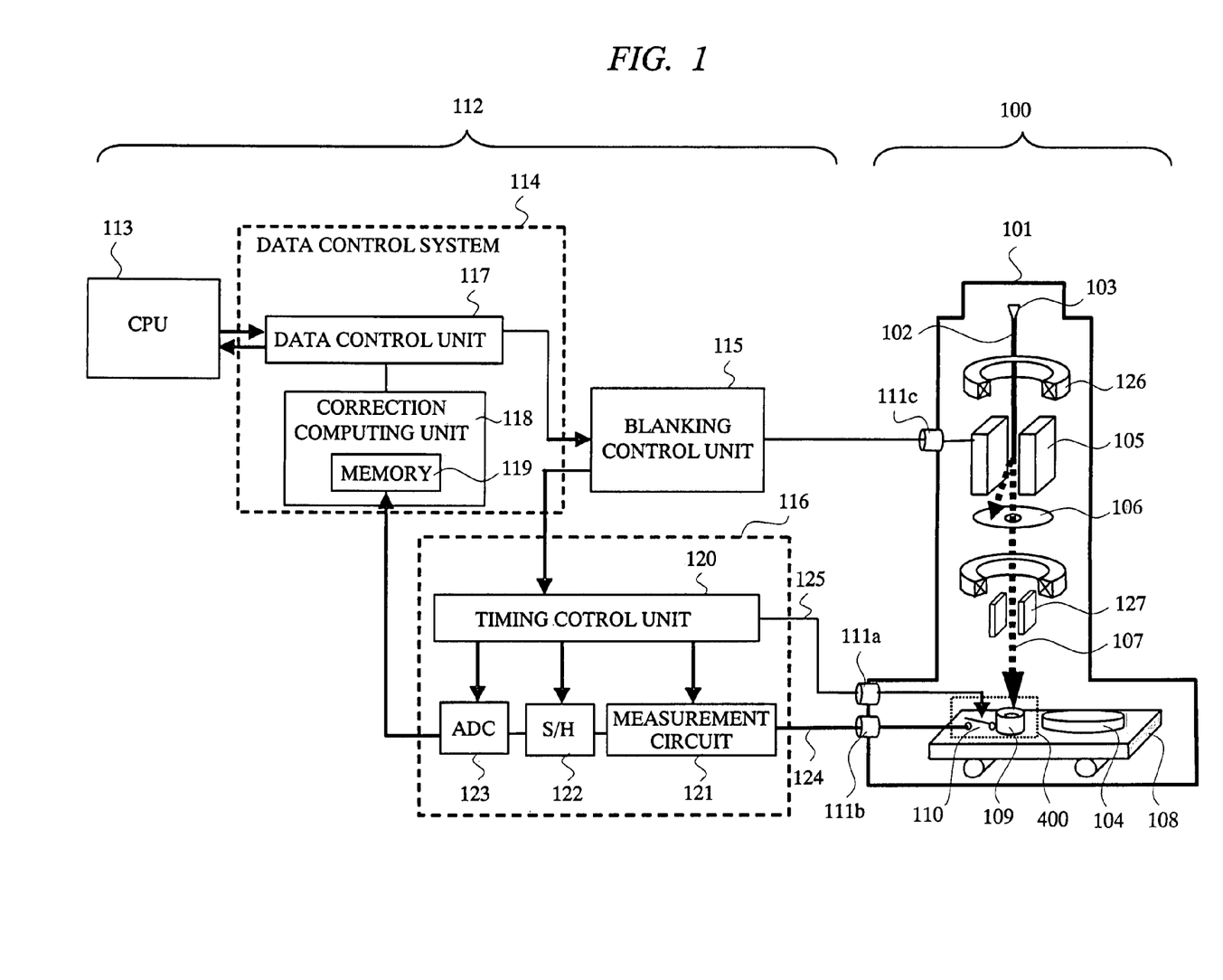
FIG. 1 is a block diagram showing a principal part of the electron beam writing system according to the first embodiment of the present invention.
Figure 2:
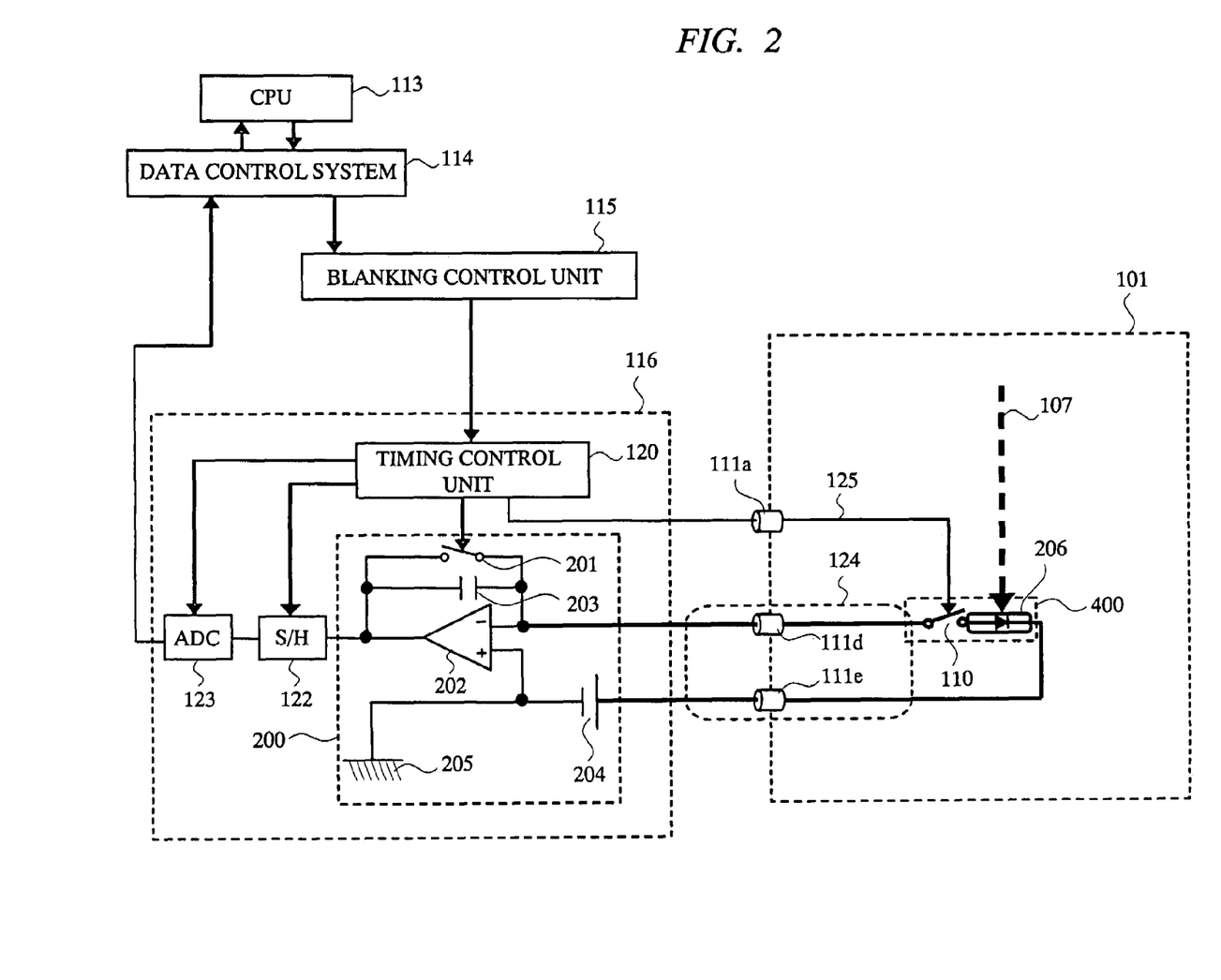
FIG. 2 is a diagram showing an example of the configuration of the electron beam writing system in which an integrating circuit is used as a measurement circuit and a semiconductor diode is used as an electron beam detecting device according to the first embodiment of the present invention.
Figure 3:
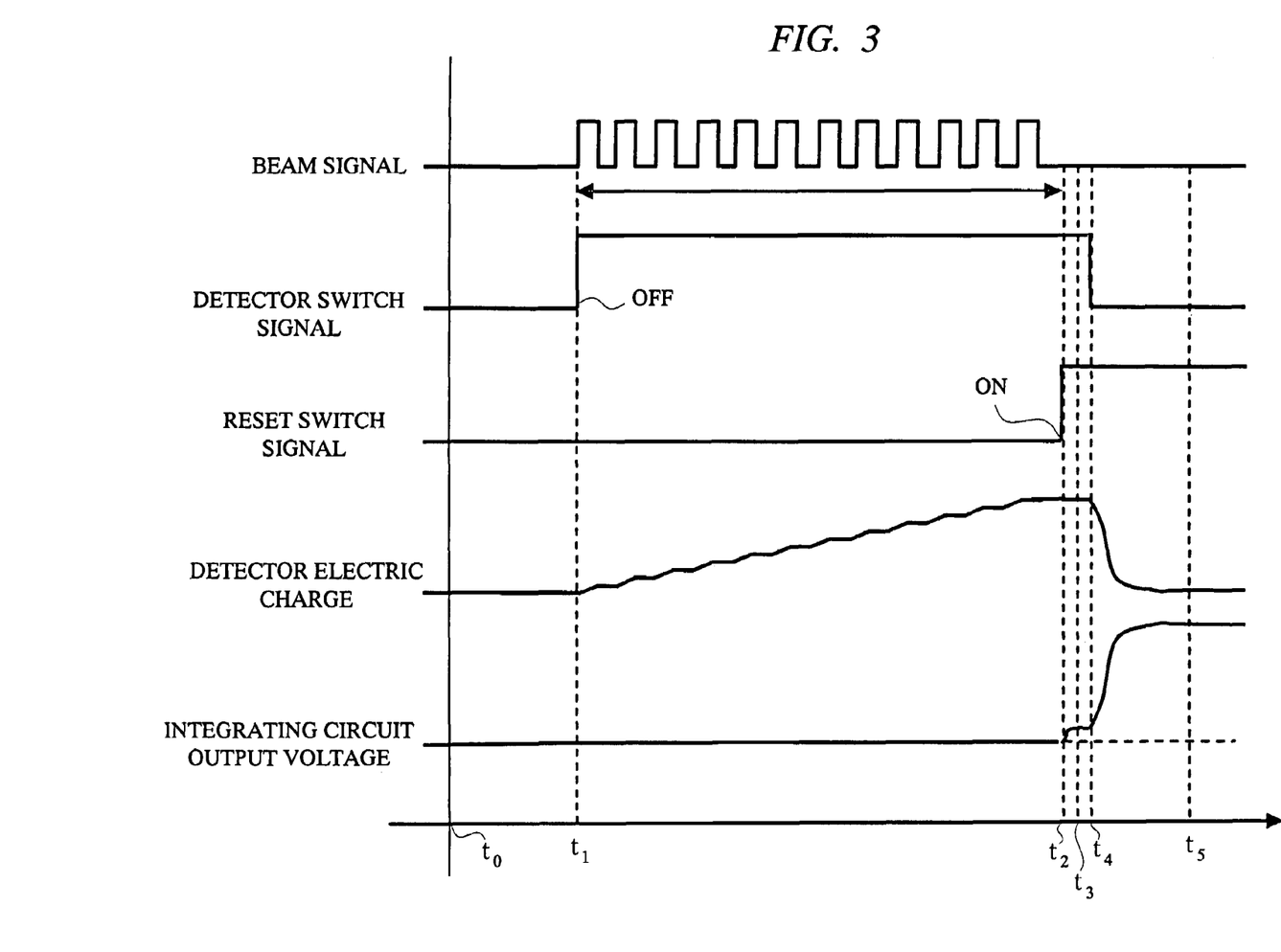
FIG. 3 is a diagram showing the timings in the beam current measurement according to the first embodiment of the present invention.
Figure 4A:
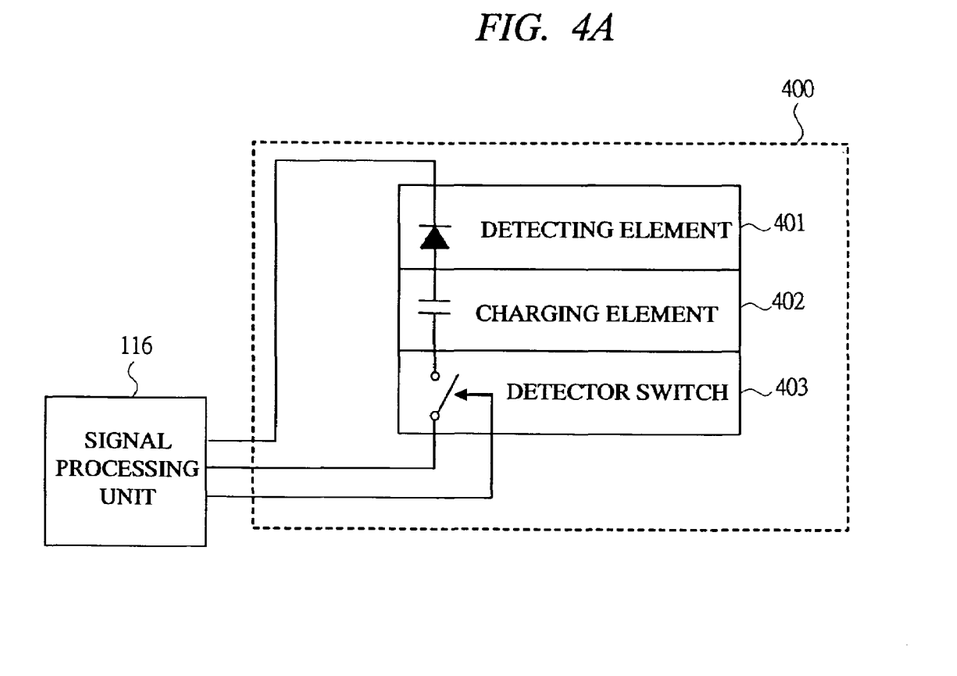
FIG. 4A and FIG. 4B are block diagrams showing the electron beam detector in which an electron beam detecting element, a charging element and a switch are incorporated according to the first embodiment of the present invention.
Figure 4B:
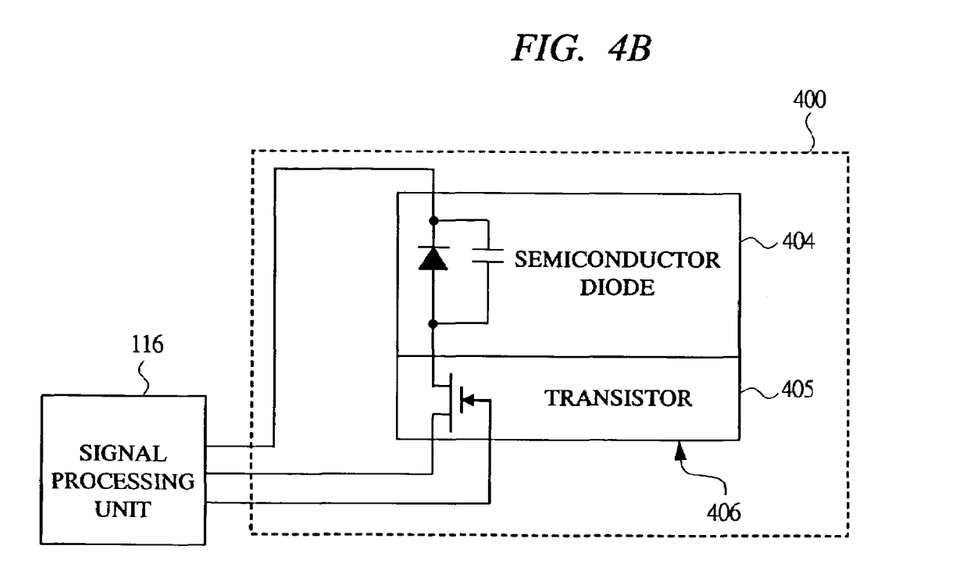
Figure 5A:
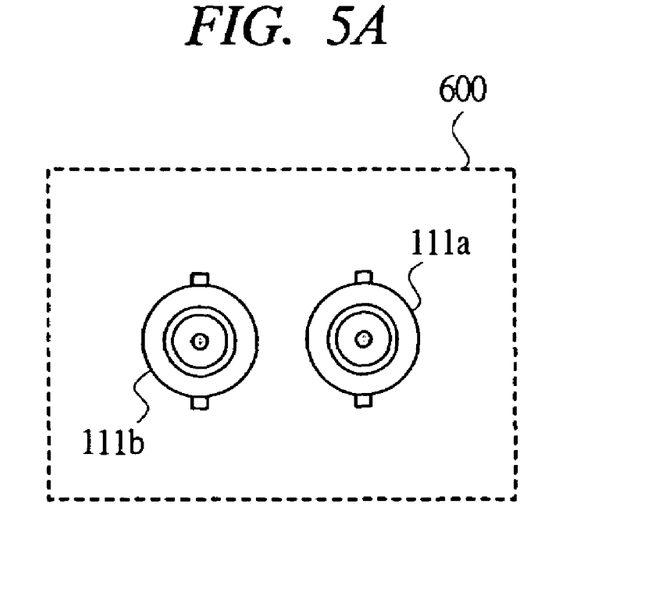
FIGS. 5A and 5B are diagrams showing the arrangement of cable terminals according to the first embodiment of the present invention.
Figure 5B:
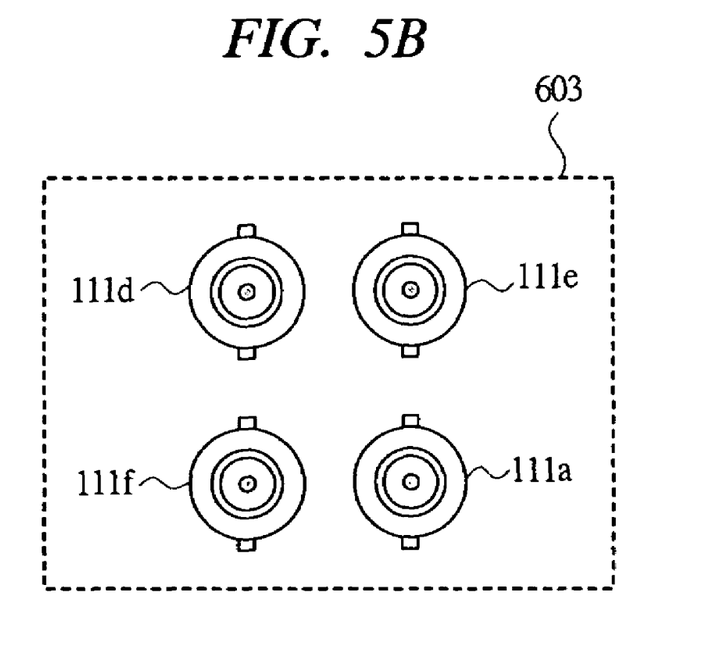

FIG. 1 is a block diagram showing a principal part of the electron beam writing system according to the first embodiment of the present invention, FIG. 2 is a block diagram showing an example of the case where an integrating circuit is used as a measurement circuit and a semiconductor diode is used as an electron beam detecting device in the electron beam writing system according to the first embodiment, FIG. 3 is a diagram showing, the timings in the beam current measurement, FIG. 4A and FIG. 4B are block diagrams showing the electron beam detector in which an electron beam detecting device, a charging element and a switch are incorporated, and FIG. 5 is a diagram showing the arrangement of cable terminals (hermetic connector).

First, an example of the configuration of the electron beam writing system according to the first embodiment will be described with reference to FIG. 1. The electron beam writing system according to the first embodiment is, for example, a writing system using the point beam and is comprised of electron optical apparatus 100 and a control system 112.

The electron optical apparatus 100 is comprised of an evacuated vacuum column 101, an electron gun 103 for generating electron beam 102, lens 126 for focusing the electron beam 102, a blanking electrode 105 and a blanking aperture 106 for turning on/off the electron beam 102, an electron beam detector 400 including an electron beam detecting device 109 for measuring the beam current of the electron beam and a detector switch 110 for turning on/off the electron beam detecting device 109, a movable stage 108 on which a sample 104 such as a silicon wafer for forming the writing pattern and the electron beam detector 400 (electron beam detecting device 109 and detector switch 110) are mounted, a deflector 127 for determining the position of the electron beam on the movable stage 108, cable terminals (hermetic connector) 111 for leading the wiring system to the air, and the like.

In the electron beam detector 400, the electron beam detecting device 109 is provided with a charging element for accumulating electric charge of detected signals therein. A detecting device with a multiplication effect to the electron beam, for example, a semiconductor diode such as a photodiode or an avalanche diode, MCP (micro channel plate), and an electron multiplier tube is desirably used as the electron beam detecting device. Also, a switch with low leakage current is used as the detector switch 110, and the detector switch 110 is provided at a position as close as possible to the electron beam detecting device 109 on the stage 108. By doing so, the signals accumulated in the electron beam detecting device 109 can be transferred via the detected signal line 124.

The control system 112 is comprised of a CPU 113 for controlling the overall control system 112, a data control system 114 for performing various data processings, a blanking control unit 115, a signal processing unit 116 and the like. The data control system 114 includes a data control unit 117, a correction computing unit 118 for correcting the exposure dose based on the measurement result of the amount of current, and the like. The correction computing unit 118 includes a correction data memory 119. The signal processing unit 116 is provided with a timing control unit 120, a measurement circuit 121, a sample-and-hold circuit (S/H) 122 for sampling the output voltage of the measurement circuit 121, an analog-digital converter (ADC) 123 for converting the sampled analog signals into digital signals and the like.

The CPU 113 is connected to the data control system 114, the data control system 114 is connected to the blanking control unit 115 and the signal processing unit 116, and the blanking control unit 115 is connected to the signal processing unit 116. Also, the blanking control unit 115 is connected to the blanking electrode 105 via a cable terminal 111c, the timing control unit 120 in the signal processing unit 116 is connected to the control terminal of the detector switch 110 in the electron beam detector 400 via a control signal line 125 and a cable terminal 111a, and the measurement circuit 121 is connected to the detector switch 110 via the detected signal line 124 and a cable terminal 111b.

In this electron beam writing system, the electron beam 102 is pulsed and the pulse width during the beam-on time is controlled to form the writing pattern.

In the electron optical apparatus 100, the electron beam 102 generated from the electron gun 103 is focused and deflected by the lens 126 and the deflector 127, and then reaches the electron beam detecting device 109 and the sample 104 on the movable stage 108. During the beam-off time, the electron beam 102 is deflected by the blanking electrode 105 and is irradiated to the blanking aperture 106 to block the electron beam. By applying the pulse voltage to the blanking electrode 105, the electron beam 102 is turned on/off to generate the pulse beam 107.

Also, in the control system 112, the timing control unit 120 in the signal processing unit 116 controls the timings of the blanking control unit 115, the analog-digital converter 123, the sample-and-hold circuit 122 and the measurement circuit 121 in the signal processing unit 116, and the data control unit 117.

The generated electron beam 102 or the pulse beam 107 is irradiated to the electron beam detecting device 109. The signals detected by the electron beam detecting device 109 are transferred to the measurement circuit 121 via the detected signal line 124 and measured therein. Based on the measurement result, the amount of current of the electron beam is calculated.

The correction computing unit 118 in the data control system 114 has a function to create the correction data based on the measurement data of the amount of beam current transmitted from the signal processing unit 116 and it stores the correction data at each address in the memory 119. When performing the wiring, the correction data created in advance for the wiring pattern data is read from the memory 119 so as to correct the beam-on time. By doing so, the writing with the desired irradiation dose can be performed. Note that, in the electron beam writing system using the variable shaped beam, based on the measurement result of the beam current, the area of the electron beam is corrected to control the irradiation dose.

Next, the procedure for measuring the amount of electron beam current in the electron beam writing system according to the first embodiment will be described. When measuring the beam current, the activation signal to start the measurement is first issued from the CPU 113, and the writing pattern data for measuring the beam irradiation dose is transferred to the data control system 114. At the same time, the movable stage 108 is moved so that the electron beam detecting device 109 is moved to the beam irradiation position.

In the data control system 114, the writing pattern data for measuring the beam irradiation dose is converted into the beam-on time and the number of pulses, and the converted data is transferred to the blanking control unit 115. The setting value of the beam-on time is calculated in consideration of the amount of beam current of the electron beam 102 before being pulsed and the response delay of the blanking based on the past measurement result. A detail description of the calculating method is omitted here. At this time, the activation signal of the measurement of beam irradiation dose is sent to the timing control unit 120 in the signal processing unit 116.

The blanking control unit 115 applies the pulse voltage corresponding to the transferred data to the blanking electrode 105 to generate the pulse beam 107. The object to be measured in the measurement method according to the first embodiment is not limited to the pulsed electron beam, but the measurement method of the pulse beam will be described here.

The timing control unit 120 in the signal processing unit 116 turns off the detector switch 110 by the control signal sent via the control signal line 125 simultaneously with or before the irradiation of the pulse beam 107 to electrically disconnect the electron beam detecting device 109 and the latter-stage measurement circuit 121. The blanking control unit 115 outputs the pulse voltage corresponding to a predetermined number of pulses to irradiate the pulse beam 107 to the electron beam detecting device 109, and the detected signals are accumulated in the electron beam detecting device 109 as the electric charge. After irradiating the pulse beam corresponding to the number of pulses of the writing pattern data for measuring the beam irradiation dose, the detector switch 110 is turned on in accordance with the control signal transmitted from the timing control unit 120 via the control signal line 125, and the charge accumulated in the electron beam detecting device 109 is sent to the measurement circuit 121. Then, after the amount of charge is measured as voltage in the measurement circuit 121, the output voltage is sampled by the latter-stage sample-and-hold circuit 122 and the analog signal is converted into the digital signal by the analog-digital converter 123, and then, the converted data is stored in the memory 119 in the correction computing unit 118. Based on the stored data, the correction computing unit 118 determines whether difference of the measured value from the setting value is within an allowable range. This allowable range is determined depending on the setting accuracy of the irradiation dose which is determined by the dimensional accuracy of the beam writing. When the difference between the setting value and the measured value is not within the allowable range, the correction computing of the beam irradiation dose is performed, and the corrected beam-on time is transferred to the blanking control unit 115. At the same time, the activation signal is issued also to signal processing unit 116 and the measurement operation described above is repeated again.

As described above, the irradiated beam current is calculated based on the amount of charge accumulated in the electron beam detecting device 109 to correct the beam-on time, and the beam irradiation dose in the writing is determined. In this method, since the accumulated signals are transmitted through the detected signal line 124, the signals is hardly influenced by the noise overlapped in the detected signal line 124, and the beam current can be measured with high accuracy.

Next, an example of the configuration of the electron beam writing system in which an integrating circuit 200 is used as the measurement circuit 121 and a semiconductor diode 206 is used as the electron beam detecting device 109 will be described with reference to FIG. 2. Since the other part of the vacuum column 101 in FIG. 2 is the same as that in FIG. 2, the description thereof is omitted.

In the integrating circuit 200, an operational amplifier 202 is used and a capacitor element 203 as a feedback capacitor is connected to the operational amplifier 202, and a reset switch 201 for resetting the integrating signal of the capacitor element 203 is provided between the input and the output of the operational amplifier 202. Also, a positive pole of a bias supply 204 is connected to a cathode of the semiconductor diode 206, and a negative pole of the bias supply 204 is connected to a ground 205 of the integrating circuit 200 and an input of the operational amplifier 202. An anode of the semiconductor diode 206 is connected to the detector switch 110. The saturation value of the semiconductor diode 206 will be described later in detail. The reset switch 201 of the integrating circuit 200 is connected to the timing control unit 120. In the operation, after receiving the control signal from the timing control unit 120 to reset the capacitor element 203 by the reset switch 201, the integration is started in the integrating circuit 200.

In the measurement method of beam irradiation dose in this electron beam writing system, by the timing control unit 120 connected to the detector switch 110 via the control signal line 125, the detector switch 110 is turned off simultaneously with or before the irradiation of the pulse beam or the electron beam. By doing so, the semiconductor diode 206 is electrically disconnected from the detected signal line 124 and the detected signals are accumulated in the semiconductor diode 206. Then, by turning on the detector switch 110 after the stop of the pulse beam or electron beam irradiation, the accumulated signals are measured by the latter-stage signal processing unit 116.

Next, an example of the timing control in these measurement methods will be described with reference to FIG. 3.

In FIG. 3, the beam signal indicates the beam current intensity detected in the semiconductor diode 206.

The detector switch signal indicates the control signal which controls the detector switch 110. When the signal is high, the detector switch 110 is turned off and the semiconductor diode 206 is electrically disconnected from the latter-stage detected signal line 124. Also, when the signal of the detector switch is low, the detector switch 110 is turned on and the semiconductor diode 206 is electrically connected to the latter-stage detected signal line 124.

The reset switch signal indicates the control signal which controls the reset switch 201. When the signal is high, the reset switch 201 is turned off and the charge accumulated in the detecting device is stored and integrated in the capacitor element 203 of the integrating circuit 200. Also, when the reset switch signal is low, the reset switch 201 is turned on and the charge of the capacitor element 203 is reset.

The detector electrical charge indicates the amount of charge accumulated in the electron beam detecting device of the semiconductor diode 206. The integrating circuit output voltage indicates the output voltage of the integrating-circuit 200.

At the time $t_0$, by the activation signal from the CPU 113, the writing pattern data for measuring the beam irradiation dose is converted into the beam-on time and the number of pulses by the data control unit 114, and the converted data is transferred to the blanking control unit 115. Note that the beam irradiation time indicates the period of time for irradiating the electron beam corresponding to the number of pulses converted based on the writing pattern data for measuring the beam irradiation dose, and it is the period between time $t_1$ and time $t_2$ in this case. The number of pulses is arbitrary value and the number of pulses may be 1, that is, the electron beam may be continuously irradiated.

At the time $t_1$, the blanking control unit 115 generates the pulse beam. At the same time, the timing control unit 120 turns off the detector switch 110 by the activation signal from the blanking control unit 115 via the control signal line 125. It is not always necessary to turn off the detector switch 110 simultaneously with the start of the irradiation of the pulse beam. However, it should be turned off at least between the time to and the time $t_1$. By irradiating the pulse beam 107 to the semiconductor diode 206, the amount of charge in the semiconductor diode 206 is increased.

At the time $t_2$, the pulse beam 107 to be measured is stopped, and simultaneously, the end signal from the blanking control unit 115 is transferred to the timing control signal 120, and the reset switch 201 is turned off and the integrating circuit 200 is turned on. At this time, the output voltage of the integrating circuit is slightly increased due to the offset current of the operational amplifier 202.

At the time $t_3$, the output voltage is sampled by the sample-and-hold circuit 122 at the timing when the offset output of the integrating circuit 200 is stabilized. Then, it is converted into the digital data by the analog-digital converter 123 and is stored as the offset voltage in the memory 119 in the data control unit 114.

At the time $t_4$, the detector switch 110 is turned on at the timing when the sampling of the offset voltage is finished, and the charge accumulated in the semiconductor diode 206 is transferred to the integrating circuit 200.

At the time $t_5$, all of the charge in the semiconductor diode 206 is transferred to the integrating circuit 200 and is sampled by the sample-and-hold circuit 122 again at the timing when the output voltage of the integrating circuit 200 is stabilized. Thereafter, it is converted into the digital data by the analog-digital converter 123 and then stored in the memory 119. The measured irradiation dose is obtained by subtracting the above-mentioned offset charge.

As described above, since the signal is taken after accumulating the charge in the semiconductor diode 206, the highly accurate current measurement in which the influence from the electromagnetic noise overlapped in the detected signal line 124 is reduced as much as possible can be realized.

Next, an example of the configuration of the electron beam detector 400 will be described with reference to FIG. 4A and FIG. 4B.

The electron beam detector 400 shown in FIG. 4A is characterized in that a detecting element 401, a charging element 402 and a switch 403 are incorporated therein. The detecting element 401 is, for example, a Faraday cup, a semiconductor diode with a multiplication effect to the electron beam (photodiode or avalanche diode), MCP and an electron multiplier tube. When an element with a multiplication effect is used, the output current is compared with that in the detection method using a Faraday cup and the absolute correction is performed to measure the precise multiplication factor. Note that the detecting element 401 and the charging element 402 correspond to the electron beam detecting device 109 and the switch 403 corresponds to the detector switch 110 of FIG. 1.

The electron beam detector 400 shown in FIG. 4B is characterized in that the detecting element and the charging element are incorporated in the same semiconductor substrate. The semiconductor diode 404 is used as the detecting element and the charging element, and the junction capacitance of the semiconductor diode 404 is used as the charging element. A field effect transistor 405 is used as the switch. Then, the semiconductor diode 404 and the transistor 405 are incorporated in the semiconductor device 406. Note that the semiconductor diode 404 corresponds to the semiconductor diode 206 and the transistor 405 corresponds to the detector switch 110 of FIG. 2.

Next, an example of the arrangement of cable terminals (hermetic connector) for leading the wiring used in the beam current measurement into/out of the vacuum column will be described with reference to FIG. 5A and FIG. 5B. FIG. 5A and FIG. 5B show a part of a cable terminal unit present on the outer wall of the vacuum column 101 of FIG. 1 and FIG. 2. Also, FIG. 5A corresponds to FIG. 1 and FIG. 5B corresponds to FIG. 2.

In FIG. 5A, the cable terminal unit 600 is provided with the cable terminal 111a for control signal which leads the wiring to control the on/off of the detector switch 110 in the electron beam detector 400 in addition to the conventional cable terminal 111b for detected signal.

In FIG. 5B, the configuration in which the semiconductor diode 206 with a multiplication effect to the electron beam is used as the detecting device is shown. When using a device with a multiplication effect to the electron beam such as the semiconductor diode 206, the output current is compared with that in the detection method using a Faraday cup and the absolute correction is performed. Therefore, the cable terminal unit 603 is provided with a cable terminal 111f for correction signal which leads the signal line of the Faraday cup for correction and a cable terminal 111a for control signal which leads the wiring to control the on/off of the detector switch 110 in the electron beam detector 400 in addition to the cable terminal 111d for anode of the semiconductor diode 206 and the cable terminal 111e for cathode thereof.

In the case where the electron beam detector described later in which a plurality of detecting devices are arrayed according to the second embodiment is used, the number of cable terminals 111d for anode of the semiconductor diode and cable terminals 111e for cathode thereof increases in accordance with the number of detecting devices. Even in such a case, however, there are only one cable terminal 111f for correction signal and one cable terminal 111a for control terminal.

Although the larger charging element of the electron beam detector is better, when the junction capacitance of the semiconductor diode is used as the charging element like the case shown in FIG. 4B, since there is actually the saturation charge amount, the measurement more than the saturation charge amount is impossible. Therefore, the calculation method for determining the measurable upper limit of the beam current amount and the beam irradiation time in the case where the junction capacitance of a semiconductor diode is used as the charging element will be described.

For example, the calculation method in the case where the device capacitance of the semiconductor diode is 50 (pF) and the device capable of applying the forward voltage of up to 0.5 V is used will be described. The charge amount $Q_{max}$ which can be accumulated in the device is expressed by the following expression.

$$Q_{max}=50(pF)\times 0.5(V)=25(pC)$$

Since the semiconductor diode has the multiplication effect to the electron beam, the charge amount Q accumulated by the electron beam can be expressed by the following expression.

Charge amount Q=beam current amount i×multiplication factor of detecting device G×Σ beam-on time $T_{ON}$ The multiplication factor of detecting device G is determined based on the number of electron-hole pairs generated by the energy loss of the incident electrons in the depletion layer formed by the PN junction. Therefore, when the incident energy of the electron beam is $E_i$ (eV) and the energy required to generate one electron-hole pair in silicon (Si) is 3.6 eV, the multiplication factor G can be expressed by the following expression.

$$G=\alpha \cdot E_i/3.6$$

In this case, α is an energy transfer coefficient and it depends on the reflection coefficient of the device, the depth from the surface to the depletion layer and the penetration depth of the electrons. When the incident energy of electrons is 50 keV and the depth to the depletion layer is about 0.25 μm, the multiplication factor of the semiconductor diode is about 12000. In the writing system, when the device with a multiplication effect as described above is used, the output current is compared with that in the detection method using a Faraday cup and the absolute correction is performed to measure the precise multiplication factor.

Therefore, the measurable beam current amount i and total beam-on time $\Sigma T_{ON}$ during the beam irradiation in the case where the accelerating voltage of electrons is 50 keV satisfy the condition of: $25(pC) \geqq i \times 12000 \times \Sigma T_{ON}$. For example, when the beam current amount is about 1 nA, the beam irradiation time $\Sigma T_{ON}$ is about 2 μs.

By setting the upper limit of the beam current amount and the beam irradiation time in accordance with the method described above, the signal as large as possible can be transmitted in the long signal line of the electron beam writing system. Therefore, the influence by the overlapped noise can be reduced and the beam current amount can be calculated with high accuracy.

Second Embodiment

Figure 6:
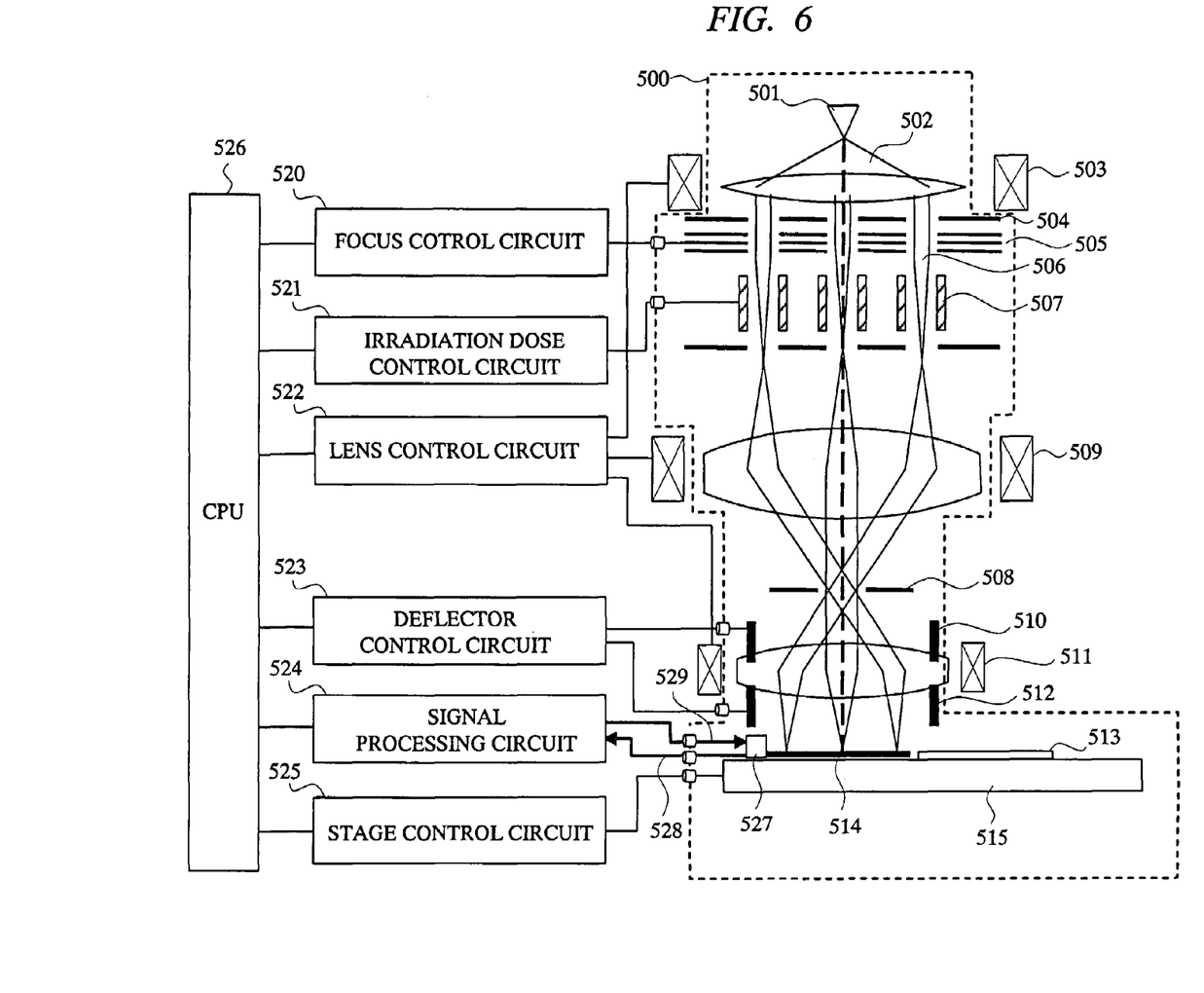
FIG. 6 is a block diagram showing the electron beam writing system using multiple electron beams according to the second embodiment of the present invention.
Figure 7:
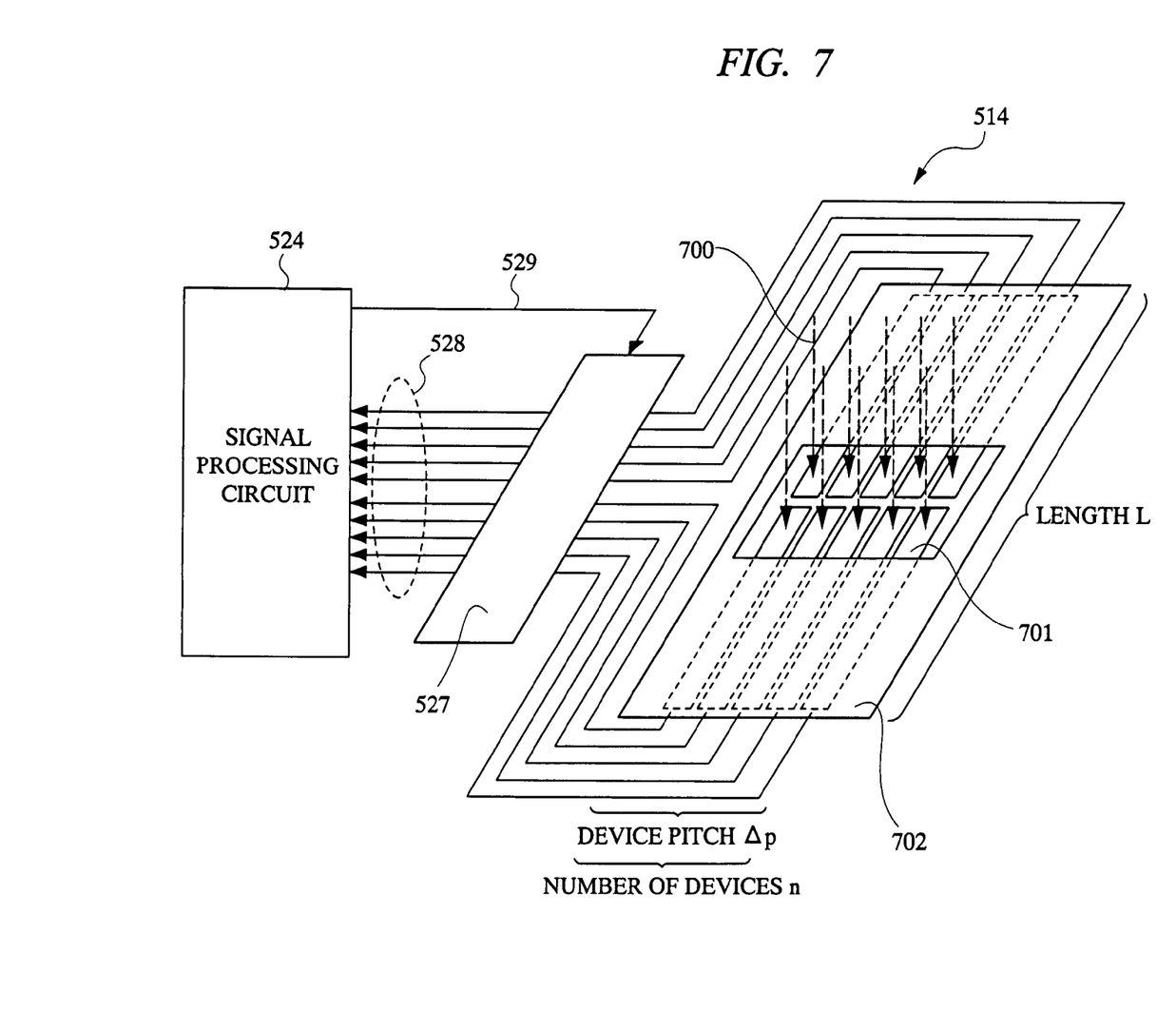
FIG. 7 is a diagram showing the configuration of the electron beam detector according to the second embodiment of the present invention.

FIG. 6 is a block diagram showing the principal part of the electron beam writing system using multiple beams according to the second embodiment of the present invention, and FIG. 7 is a diagram showing the configuration of the electron beam detector in the electron beam writing system using multiple beams according to the second embodiment.

First, an example of the configuration of the electron beam writing system using multiple beams according to the second embodiment will be described with reference to FIG. 6. The electron beam writing system using multiple beams according to the second embodiment is, for example, a writing system using a plurality of electron beams and is comprised of an evacuated vacuum column 500, an electron gun 501 for generating electron beam 502, collimator lens 503, an aperture array 504, a lens array 505, a blanking electrode array 507 and a blanking aperture 508 for turning on/off the electron beams 506, first projection lens 509, a main deflector 510, second projection lens 511, a sub deflector 512, an electron beam detector including an electron beam detecting device array 514 for measuring beam current of the plurality of electron beams and a detector switch 527 for turning on/off the electron beam detecting device array 514, a stage 515 on which a sample 513 to form a writing pattern such as a silicon wafer, the electron beam detecting device array 514 and the detector switch are mounted, a focus control circuit 520, a dose control circuit 521, a lens control circuit 522, a deflector control circuit 523, a signal processing circuit 524, a stage control circuit 525, a CPU 526, a detected signal line 528, a control signal line 529 and others.

In the vacuum column 500, a plurality of electron beams 506 are formed from the electron beam 502 generated from the electron gun 501 by the collimator lens 503, the aperture array 504 and the lens array 505. The plurality of electron beams 506 are independently turned on and off by the blanking electrode array 507 and the blanking aperture 508 and are projected onto the sample 513 through the first projection lens 509 and the second projection lens 511. At this time, the positions of the plurality of electron beams 506 on the sample 513 are concurrently scanned by using the main deflector 510 and the sub deflector 512. By synchronizing the scanning with the turning on/off of the electron beams 506 and moving the sample 513 by means of the stage 515, the writing is performed on the entire surface of the sample.

The focus control circuit 520 controls the lens array 505, the dose control circuit 521 controls the blanking electrode array 507, the lens control circuit 522 controls the first projection lens 509 and the second projection lens 511, the deflector control circuit 523 controls the main deflector 510 and the sub deflector 512, and the stage control circuit 525 controls the stage 515, respectively. The signal processing circuit 524 detects the signals from the electron beam detecting device array 514 to perform the signal processing. This electron beam detecting device array 514 is a detecting device array in which a plurality of detecting devices such as a semiconductor diode and the like are arranged, and can measure a plurality of beams at the same time. Also, a charging element is provided in the electron beam detecting device array 514. The CPU 526 controls all of these units.

Note that the dose control circuit 521 is provided with blanking control means and a correction computing unit for creating the correction data of the beam-on time and performing the correction computing, which is the same configuration as that of the blanking control unit 115 and the correction computing unit 118 shown in FIG. 1. Also, the signal processing circuit 524 is provided with a timing control unit, a measurement circuit, a sample-and-hold circuit and an analog-digital converter, which is the same configuration as that of the timing control unit 120, the measurement circuit 121, the sample-and-hold circuit 122, and the analog-digital converter 123 shown in FIG. 1. However, except for the timing control unit, a plurality of the same type of measurement circuits, sample-and-hold circuits and analog-digital converters are arrayed in order to measure a plurality of beams at the same time.

Also, the detector switch 527 is means for electrically disconnecting the output units of the plurality of detecting devices, in which the same type of the detector switches 110 shown in FIG. 1 are arranged. Also, the detected signal line 528 are comprised of a plurality of the same type of the detected signal lines 124. On the other hand, the control signal line 529 has the same configuration as that of the control signal line 125.

In this electron beam writing system using multiple electron beams, the characteristics of each electron beam differ in some cases due to the emission current density distribution from the electron gun 501 and the mechanical difference in the components constituting the electron optical apparatus. Therefore, even when the same beam-on time is set, the beam irradiation dose of the respective beams differs, and thus, the dimensions of the written patterns do not become uniform. For this reason, the current amount of each of the beams is measured and the characteristic data of the respective irradiation doses is created to correct the beam-on time.

However, the increase in the number of beams results in the longer current measurement time, and thus, it is necessary to reduce the measurement time. Also, the length of the detected signal line 528 is about several tens cm to several m, and a plurality of cables are arrayed in parallel. Such a long signal line is greatly influenced by the surrounding electromagnetic noise and it is very difficult to transmit the weak detected signal. Therefore, the method described in the first embodiment in which the electric charge is accumulated in the detecting device and the accumulated signals are measured is applied to the plurality of beams at the same time. By doing so, the influence from the electromagnetic noise overlapped in the long detected signal line 528 can be reduced.

Next, the configuration of the electron beam detector comprised of the electron beam detecting device array 514 and the detector switch 527 will be described in detail with reference to FIG. 7. In this configuration, a plurality (2×n) of detecting devices such as the semiconductor diodes for detecting the plurality of electron beams 700 are arrayed (semiconductor diode array 701) with the device pitch in one direction of Δp, the number of devices n and the length L. Also, the signal lines for taking the respective signals of the detecting devices are connected to the detector switch 527, and the outputs of the detecting devices are opened and closed by transferring the signals from the timing control unit in the signal processing circuit 524 to the switch 527 through the control signal line 529 in synchronization with the generation and termination of the electron beam in the same manner as that of the first embodiment. In this manner, the accumulated signals are transferred through the detected signal line 528 and measured by the measurement circuit in the latter-stage signal processing circuit 524.

The device pitch Δp is set to twice or more of the range of the electron beam and to an integral multiple of the beam pitch of the plurality of electron beams 700. The number of devices n is equal to or more than the value obtained by dividing the number of beams in one line by the device pitch Δp.

For example, since the range in the silicon is 20 μm when the incident energy of electrons is 50 keV, the device pitch Δp is 40 μm when the beam pitch is 2 μm. As described in the first embodiment, when the accelerating voltage is 50 keV, the beam current amount is about 1 nA and the total of the beam-on time is 10 μs or less, the device capacitance of 24 pF or more is required in each detecting device.

The device capacitance C of the semiconductor diode is the sum of the package capacitance and the junction capacitance $C_j$ of the semiconductor diode. In order to minimize the influence by the noise, the accumulated signals are accumulated in the junction capacitance of the device as much as possible. The junction capacitance of the semiconductor diode depends on the device area A of the semiconductor diode and the depletion layer thickness T and has the following relation.

$$Cj \propto \frac{A}{T^{1/2 \sim 1/3}}$$

The junction capacitance $C_j$ can be increased by reducing the depletion layer thickness T or increasing the device area A. In the case of the electron beam of 50 keV, the range in silicon is 20 μm, and when the depletion layer thickness T is further reduced, the detection efficiency is degraded. Therefore, the device area A is increased. However, since the device pitch Δp is 40 μm, the adjustment by the length L is the simplest way to obtain the device capacitance of 24 pF or more. When the device pitch Δp is 40 μm, the length L of about 7.5 mm or more is required in order to achieve the device capacitance of 24 pF or more.

In the writing system using multiple beams, the beam area is about 100 μm square. Therefore, for the simultaneous measurement of as many beams as possible, the array structure of (2×n) detecting devices is formed as shown in FIG. 7.

Also, since only the edge parts of the very thin detecting devices are used to detect the beams as shown in FIG. 7, there are the many areas to which the beams are not irradiated, and the electromagnetic wave incident to the non-irradiated areas becomes the noise source and causes the measurement error. Therefore, it is necessary to prevent the electromagnetic wave incoming to the surfaces of the detecting devices to which the beams are not irradiated. For its achievement, a shield plate 702 is provided on upper surfaces of the devices. This shield plate 702 has an opening larger than the diameters of each of the irradiated electron beams. Although the number of openings is one in FIG. 7, it is also possible to form a plurality of openings for each of the detecting devices. Preferably, the shield plate 702 may be made of heavy metal with the atomic number higher than that of tantalum in order to prevent the penetration of the electromagnetic wave and the electron beam as much as possible. In such a heavy metal, the range of electron beam with the accelerating voltage of 50 keV is about 2 μm. Furthermore, the thickness of the shield plate 702 is set to about 0.5 mm so as to shield the high-energy electromagnetic waves as much as possible.

As described above, according to the second embodiment, in the writing system using multiple beams, the influence from the noise of the signal line can be reduced, and the current measurement can be efficiently performed and the accurate measurement of irradiation dose can be achieved.

Third Embodiment

In this embodiment, further system, apparatus and components are disclosed.

An electron beam detector comprises an electron beam detecting element, a charging element for accumulating current detected by said electron beam detecting element as electric charge, and a switch for opening/closing output of said charging element, wherein said electron beam detecting element, said charging element and said switch are formed in the same semiconductor substrate.

An electron beam writing system comprises multiple beam generating means for generating a plurality of electron beams, an electron beam detecting device array comprised of a plurality of electron beam detecting devices which simultaneously detect electron beam current of said plurality of electron beams, a plurality of transmitting means for transmitting detected signals from said plurality of electron beam detecting devices, a plurality of measurement means for measuring said detected signals, blanking means for individually turning on/off said electron beams, blanking control means for controlling said blanking means, lens for focusing said plurality of electron beams on a sample, a deflector for determining positions of said electron beams on said sample, a movable stage on which said sample and said plurality of electron beam detecting devices are mounted, data control means for performing various data processings, and a CPU for controlling these devices and means, wherein said electron beam writing system further comprises a plurality of charging elements for accumulating current detected by said plurality of electron beam detecting devices in said electron beam detecting device array as electric charge, a plurality of switches for electrically connecting and disconnecting said plurality of charging elements and said plurality of measurement circuits, a timing control unit for controlling open/close of said plurality of switches, and control signal transmitting means for transmitting control signals from said timing control unit to said plurality of switches.

In the electron beam writing system described above, said plurality of switches are mounted on said movable stage.

An electron beam detector comprises a plurality of electron beam detecting elements, a plurality of charging elements for accumulating detected signals of said plurality of electron beam detecting elements, and a plurality of switches for opening/closing outputs of said plurality of charging elements, wherein said plurality of electron beam detecting elements, said plurality of charging elements and said plurality of switches are formed in the same semiconductor substrate.

An electron beam detector comprises a plurality of electron beam detecting devices for detecting electron beam current of a plurality of electron beams, wherein said electron beam detecting devices are a plurality of semiconductor detecting devices arrayed two dimensionally and a device pitch in one direction is twice or more of a range of said electron beam and is an integral multiple of a beam pitch of said plurality of electron beams.

An electron beam detector comprises a plurality of electron beam detecting elements for detecting electron beam current of a plurality of electron beams, and a shield plate having an opening larger than a beam diameter of said electron beam.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the foregoing embodiments, the case of using the electron beam has been described. However, the beam to be used is not limited to the electron beam, but other charged particle beams are also available.

The invention disclosed in this application can be applied to the electron beam writing system used for the manufacture of semiconductor devices.

What is claimed is:

1. A measurement method of electron beam current comprising:
   irradiating two-dimensionally a plurality of electron beams to at least one target area on a surface of an electron beam detector simultaneously with or after electrically disconnecting a charging element and a measurement circuit by a switch provided between said charging element and said measurement circuit;
   detecting said irradiated electron beams with the electron beam detector having a plurality of electron beam detecting devices two-dimensionally arrayed therein, while shielding with a shield plate an area on the surface of the electron beam detector other than said target area;
   accumulating electron beam current detected by the electron beam detector in the charging element as an electric charge;
   connecting the charging element and the measurement circuit by the switch after a predetermined beam irradiation time passes;
   calculating an amount of the electron beam current based on the electric charge accumulated in said charging element,
   wherein, in said electron beam detector,
   a device pitch of said electron beam detecting devices in one direction is set as twice or more of a range of said plurality of electron beams, and
   the device pitch is set as an integral multiple of a beam pitch of said plurality of electron beams in said direction.

2. The measurement method of electron beam current according to claim 1, wherein said amount of electron beam current and said beam irradiation time are determined so that an accumulated charge amount determined by the product of said amount of electron beam current, a multiplication factor of said electron beam detecting device and said beam irradiation time becomes equal to or lower than a saturation charge amount of said charging element.

3. An electron beam writing system in which a plurality of electron beams are irradiated to a sample, comprising:
   electron beam generating means for generating two-dimensionally the plurality of electron beams;
   an electron beam detector having at least one target area on a surface thereof for detecting electron beam current accumulated from the plurality of electron beams received thereon;
   transmitting means for transmitting detected signals of said electron beam detector;
   measurement means for measuring said detected signals;
   blanking means for turning on/off said electron beams;
   blanking control means for controlling said blanking means;
   lens for focusing said electron beams on the sample;
   a deflector for determining positions of said electron beams on said sample;
   a movable stage on which said sample and said electron beam detector are mounted;
   data control means for performing various data processings;
   a CPU for controlling these devices and means;
   a charging element for accumulating beam current detected by said electron beam detector as electric charge;
   a switch for electrically connecting and disconnecting said charging element and said measurement means;
   a timing control unit for controlling open/close of said switch; and
   control signal transmitting means for transmitting control signals from said timing control unit to said switch,
   wherein in said electron beam detector, a plurality of semiconductor detecting devices are arrayed two-dimensionally, a device pitch of said electron beam detecting devices in one direction is set as twice or more of a range of said plurality of electron beams and as an integral multiple of a beam pitch of said plurality of electron beams in said direction, and
   an area on the surface of the electron beam detector other than said target area is shielded with a shield plate.

4. The electron beam writing system according to claim 3, wherein said switch is mounted on said movable stage.

5. The measurement method of electron beam current according to claim 1, wherein the charge element includes a plurality of charge sub-elements each connected to a corresponding sub-circuit of the measurement circuit via a respective switch.

6. The electron beam writing system according to claim 3, wherein the charge element includes a plurality of charge sub-elements each connected to a corresponding measurement circuit of the measurement means via a respective switch.

7. The measurement method of electron beam current according to claim 1, wherein a part of each of the electron beam detecting devices is shielded by the shield plate.

8. The measurement method of electron beam current according to claim 7, wherein the electron beam detecting devices are arrayed in a structure of ($2 \times n$, $n \geq 1$), and an end of each of the (2×n) electron beam detecting devices is exposed from the shield plate to receive the electron beams.

9. The measurement method of electron beam current according to claim 1, wherein said target area is a square-shaped area.

10. The electron beam writing system according to claim 3, wherein a part of each of the electron beam detecting devices is shielded by the shield plate.

11. The electron beam writing system according to claim 10, wherein the electron beam detecting devices are arrayed in a structure of (2×n, n≧1), and an end of each of the (2×n) electron beam detecting devices is exposed from the shield plate to receive the electron beams.

12. The electron beam writing system according to claim 3, wherein said target area is a square-shaped area.

* * * * *